United States Patent [19]

Sapp et al.

[11] Patent Number: 5,342,797
[45] Date of Patent: Aug. 30, 1994

[54] METHOD FOR FORMING A VERTICAL POWER MOSFET HAVING DOPED OXIDE SIDE WALL SPACERS

[75] Inventors: Steven P. Sapp, Felton; Neil Wylie, Rohnert Park; Eugene J. C. Chen, Sunnyvale, all of Calif.

[73] Assignee: National Semiconductor Corporation, Santa Clara, Calif.

[21] Appl. No.: 978,303

[22] Filed: Nov. 17, 1992
(Under 37 CFR 1.47)

Related U.S. Application Data

[62] Division of Ser. No. 252,845, Oct. 3, 1988, abandoned.

[51] Int. Cl.$^5$ ................................ H01L 21/265
[52] U.S. Cl. ........................... 437/41; 437/29; 437/203; 437/160; 437/164; 148/DIG. 126
[58] Field of Search ............. 357/23.4, 23.1; 437/30, 437/164, 41, 29, 40, 160; 148/DIG. 126

[56] References Cited

U.S. PATENT DOCUMENTS

| | | | |
|---|---|---|---|
| 4,417,385 | 11/1983 | Temple | 357/23.4 |
| 4,646,117 | 2/1987 | Temple | 357/23.4 |
| 4,774,198 | 9/1988 | Contiero et al. | 357/23.4 |
| 4,809,047 | 2/1989 | Temple | 357/23.4 |
| 4,837,179 | 1/1989 | Foster et al. | 437/44 |
| 4,893,158 | 1/1990 | Mihara et al. | 357/23.4 |
| 4,974,059 | 11/1990 | Kinzer | 357/23.4 |
| 5,032,532 | 7/1991 | Mori et al. | 437/41 |
| 5,045,903 | 9/1991 | Meyer et al. | 357/23.4 |
| 5,079,602 | 1/1992 | Harada | 357/23.4 |
| 5,179,034 | 1/1993 | Mori et al. | 437/41 |

FOREIGN PATENT DOCUMENTS 2103419A 8/1981 United Kingdom .

*Primary Examiner*—Olik Chaudhuri
*Assistant Examiner*—H. Jey Tsai
*Attorney, Agent, or Firm*—Townsend and Townsend Khourie and Crew

[57] ABSTRACT

A vertical power MOSFET comprising a metal base on which is disposed a highly doped n+ silicon substrate. A lightly doped epitaxial layer is grown on the substrate to form a drain region for conducting electrical charge carriers to the metal base. A gate region is disposed above the drain region and has side walls forming an aperture. Disposed on each side wall and axially aligned with the gate region are doped oxide spacers. Embedded within the source region beneath the aperture is a body region comprising a heavily doped region embedded within a lightly doped region. A source region, formed by diffusion from the doped oxide spacers, is disposed below each space and embedded within the body region.

15 Claims, 2 Drawing Sheets

METHOD FOR FORMING A VERTICAL POWER MOSFET HAVING DOPED OXIDE SIDE WALL SPACERS

This is a division of application Ser. No. 07/252,845 filed Oct. 3, 1988, now abandoned.

BACKGROUND OF THE INVENTION

1. Field of the Invention

This invention relates to semiconductor devices and, more particularly, to a vertical power MOSFET.

2. Description of the Prior Art

Power MOSFETS frequently are used in high speed switching applications where their superior frequency response and switching speed can be best utilized. While the advantages offered by MOSFETS are well known, some performance detriments have been identified and must be overcome for MOSFETS to continue to remain as an attractive power switching device.

One problem with vertical power MOSFETS is the existence of a relatively high on-state voltage drop as a result of high on-state resistance. Among other things, the on-state resistance for a specified silicon area (hereinafter referred to as the "specific on-resistance") is determined by the resistivity and thickness of the epitaxial layer. Since the epitaxial layer characteristics also determine the breakdown voltage of the device, high voltage power MOSFETS have inherently higher specific on-resistance than do low voltage power MOSFETS. Furthermore, unlike bipolar transistors, the resistivity of the MOSFET drain region is not modulated by minority carrier injection. Consequently, high voltage MOSFETS have a higher specific on-resistance compared to bipolar transistors with similar die size and breakdown voltage rating. To offset the resistance advantage that high voltage bipolar transistors enjoy over power MOSFETS, improvements in the specific on-resistance are needed.

The size of the MOSFET cell, which forms the source and channel regions has been shown to have a dramatic effect on the specific on-resistance. The smaller the size of the cell, the lower the specific on-resistance. Unfortunately, cell pitch has been limited to about 16 micrometers using conventional methods, i.e., projection photolithography, plasma etching, and furnace dopant diffusion. This is a result of the required alignment tolerances of the photolithographic and etching processes, as well as lateral diffusion of the dopant impurities in the diffusion process. Alignment tolerances may be reduced by employing higher resolution equipment, but the only practical way to reduce lateral encroachment of the dopant impurities is to reduce the vertical junction depth. Unfortunately, junction depth cannot be reduced indiscriminately without degrading the durability of the device. Accordingly, the search for smaller MOSFET cells has driven power MOSFET manufacturers to employ more sophisticated equipment and processing methods with the added costs involved.

Another problem with conventional MOSFET devices is that they include a source region which acts with the body diode to form a parasitic transistor. In such a parasitic device the source region acts as the emitter, the channel body lying between the source and drain acts as the base, and the epitaxial layer forming the drain acts as the collector. The transistor is undesirable because its inadvertent activation can lead to destruction of the MOSFET.

Although the common uses of power MOSFETS are not affected by the parasitic transistor, certain modes of operation, such as unclamped inductive load switching and large dV/dt operation, can cause inadvertent activation. During unclamped inductive load switching, the MOSFET attempts to switch off the current, but the inductor resisting the change continues to force the current through the reverse biased MOSFET in an avalanche mode. A portion of this avalanche current flows through the base of the parasitic transistor. If the current is large enough and the base sheet resistance is high enough, the induced voltage drop in the base can exceed the base/emitter turn-on voltage and the parasitic transistor turns on. Similarly, during switching and other large dV/dt conditions, the charging and discharging of the PN body diode junction capacitance causes portions of the charging current to flow through the base of the parasitic transistor and, if large enough, can cause the parasitic transistor to turn on. Thus, the parasitic transistor limits the ability of a MOSFET to withstand high currents in the avalanche mode and large dV/dt conditions.

To avoid the activation condition, either the current in the base of the parasitic device must be limited, which usually is not possible in the foregoing situations, or the base spreading resistance must be minimized. One method of reducing the base spreading resistance e.g., in N-channel devices, is to add a low resistivity p-type region in the center of the cell. The p+ region effectively shorts out part of the base of the parasitic transistor, preventing the parasitic transistor from turning on. However, the accuracy of the placement of the p+ region in relation to the outside edge of the source region, as well as the length of the source region, is critical and difficult to control using conventional methods.

Finally, a large number of masking and diffusion steps ordinarily are required when manufacturing MOSFETS, and this increases the number of defects introduced during the manufacturing process. Defects generally cause device failure and reduced yield, i.e., the number of acceptable device formed on a wafer during the manufacturing process. This, of course, increases the cost of individual devices because a substantial portion of cost of devices is the semiconductor wafer in which the devices are formed.

SUMMARY OF THE INVENTION

The present invention is directed to a vertical drain planar MOSFET, and method of fabricating it, which dramatically reduces the specific on-resistance and minimizes the effect of the parasitic transistor. The device is a self-aligned structure and hence requires fewer production steps with no critical mask alignments.

In one embodiment of the present invention directed to an N-channel enhancement mode MOSFET, a lightly doped n-type epitaxial layer is grown on a heavily doped n-type silicon substrate to form a drain region. A gate region, comprising a gate oxide layer and polycrystalline silicon gate electrode layer, is formed on the epitaxial layer. An insulating layer then is formed on the gate region layers. The insulating layer and gate region layers are anisotropically etched to form a side wall and to expose a portion of the drain region. A p-type region, forming a PN body diode with the drain region, is diffused into the exposed portion of the drain region. A conformal oxide layer containing donor atoms is formed over the insulating layer, the side wall, and the exposed portion of the p-type region. The conformal layer is anisotropically etched to form doped oxide spacer regions on the side wall, thus completing the isolation of the gate region. A boron implant then enhances the surface of the p-type region to reduce contact resistance to the PN body diode and to reduce the base spreading resistance in the parasitic transistor. The implanted boron is activated and diffused at the same time as the donor atoms are driven into the silicon from the doped oxide spacers to form the n-type source region.

By forming the insulating layer over the gate region layers before etching to expose the drain region, and by completing the isolation of the gate region layers with the oxide spacers, the critical mask alignments required using conventional techniques are avoided. Since the source region is formed by out diffusion from the doped oxide spacers, the parasitic transistor characteristics caused by the size and depth of the source region, as well as the alignment of the boron doped region relative to the source region, may be carefully controlled.

The resulting structure may have a cell pitch of less than 12 micrometers allowing a hexagonal cell density of more than 5 million cells/in$^2$. The reduced cell size allows the specific on-resistance to be lowered to less than 1.5 mohm-cm$^2$, significantly less than the 1.8 mohm-cm$^2$ values previously thought possible. By substantially reducing the base spreading resistance of the parasitic transistor through accurate placement of the boron doped region, the maximum avalanche current (switching an inductive load) is significantly improved.

These and other advantages of the present invention will become apparent to those skilled in the art upon reading the following detailed description of the invention, which should be read in conjunction with the accompanying drawings.

DETAILED DESCRIPTION OF THE PREFERRED EMBODIMENTS

Figure 1:
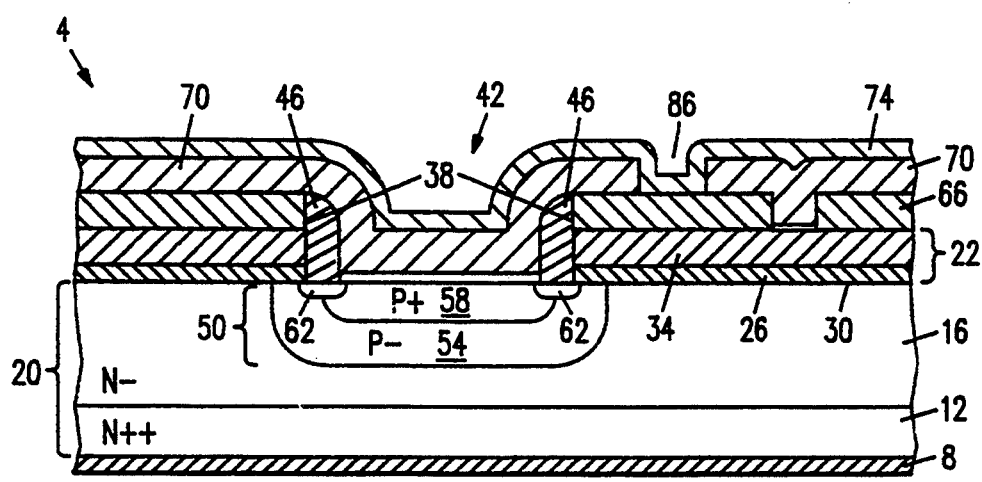
FIG. 1 is a cross-sectional view of a field effect transistor in accordance with a preferred embodiment of the present invention.

FIG. 1 is a cross-sectional view of one embodiment of an N-channel enhancement mode MOSFET 4 according to the present invention. As shown therein, MOSFET 4 comprises a metal base 8 on which is disposed a highly doped n-type silicon substrate 12. A lightly doped n-type epitaxial layer 16 is disposed on the upper surface of substrate 12. Substrate 12 and epitaxial layer 16 form a drain region 20 for conducting electrical charge carriers to metal base 8. A gate region 22 is disposed above drain region 20 and comprises a gate oxide layer 26, disposed on a planar surface 30 of epitaxial layer 16, and a gate electrode layer 34 disposed on gate oxide layer 26. Gate region 22 has side walls 38 for defining an aperture 42. Disposed on each side wall 38 of gate region 22 and axially aligned with gate region 22 are silicon dioxide spacers 46 containing a significant portion of donor atoms.

Embedded within drain region 20, beneath aperture 42, are doped regions 50 comprising a lightly doped p-type region 54 forming the channel at the upper portion thereof and a heavily doped p-type region 58 embedded within p-type region 54. An n-type source region 62 is disposed between each spacer 46 and doped regions 50. Each source region 62 is embedded within doped regions 50 and located below each spacer 46. A channel formed in doped regions 50 conduct electrical charge carriers from source regions 62 to drain region 20 in response to the electric field caused by an electrical potential applied to gate electrode 34.

Disposed on the upper surface of the structure are an insulating layer 66 and a top side metal layer 70 for providing electrical contact to gate electrode 34 and source regions 62. A passivation layer 74 is disposed above top side metal layer 70 for scratch protection.

Figure 2:
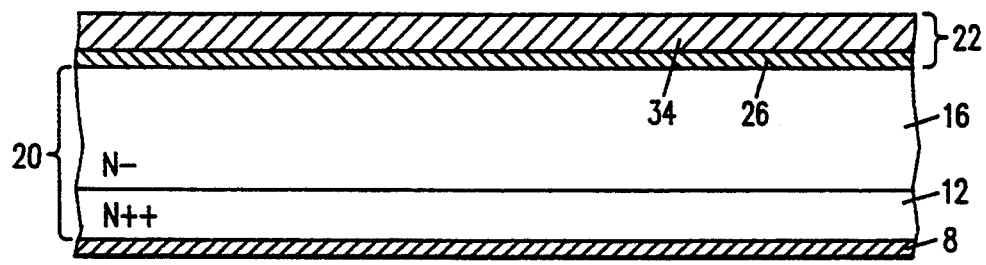
FIGS. 2-8 illustrate the steps according to one embodiment the present invention for forming the device of FIG. 1.

The steps used for forming the device shown in FIG. 1 are illustrated in FIGS. 2-8. First, an n-type monocrystalline silicon epitaxial layer 16 is grown on an n-type silicon substrate 12 as shown in FIG. 2. The epitaxial layer will be about 7 microns thick. A high integrity silicon dioxide gate insulating layer 26, about 1000 Angstroms thick, then is grown by thermal oxidation or deposited from a chemical vapor on the silicon surface of epitaxial layer 16. A Conductive polycrystalline silicon gate electrode layer 34 doped with n-type impurities is deposited above gate oxide layer 26, preferably by chemical vapor deposition.

Figure 3:
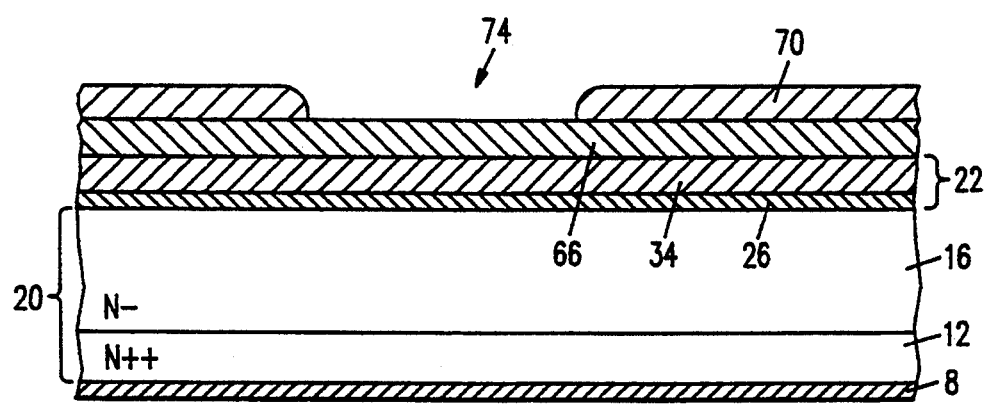

The next step, illustrated in FIG. 3, is to form insulating layer 66 above gate electrode layer 34. Insulating layer 66 preferably is formed by thermal oxidation of the polycrystalline layer 34 or by depositing silicon dioxide from a chemical vapor on gate electrode layer 34. A photoresist mask 70, having an aperture 74, then is applied to insulating layer 66.

Figure 4:
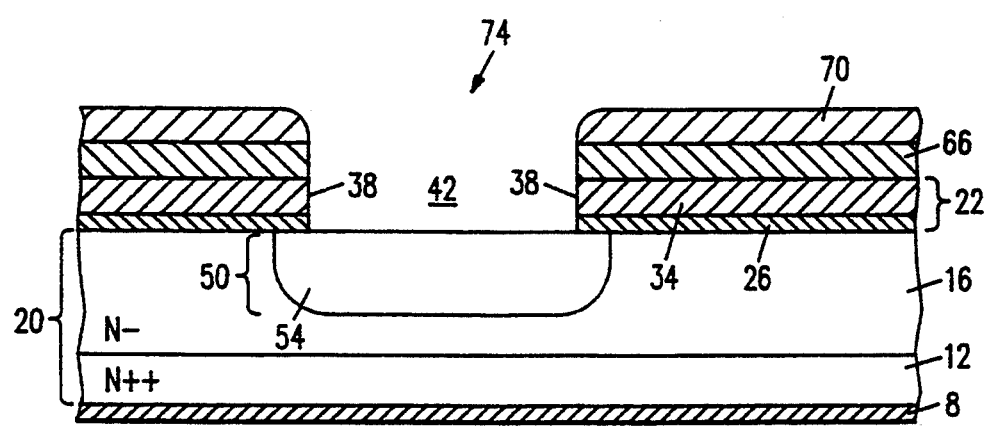

Next, as shown in FIG. 4, the portions of insulating layer 66, gate electrode layer 34, and gate oxide layer 26 below aperture 74 are etched to form side walls 38 and to expose a portion of doped regions 50. Preferably, an anisotropic etching technique, such as plasma or reactive ion bombardment, is used for this purpose. Mask 70 then may be removed using conventional techniques. Acceptor atoms, e.g., boron, then are implanted and diffused to form p-type region 54 of doped regions 50, and to form the pn body diode. Typical impurity concentrations for region 54 range from $8 \times 10^{16}$ to $1 \times 10^{18}$ atoms per cubic centimeter. The ions are introduced with an energy of 50 to 150 KeV.

Figure 5:
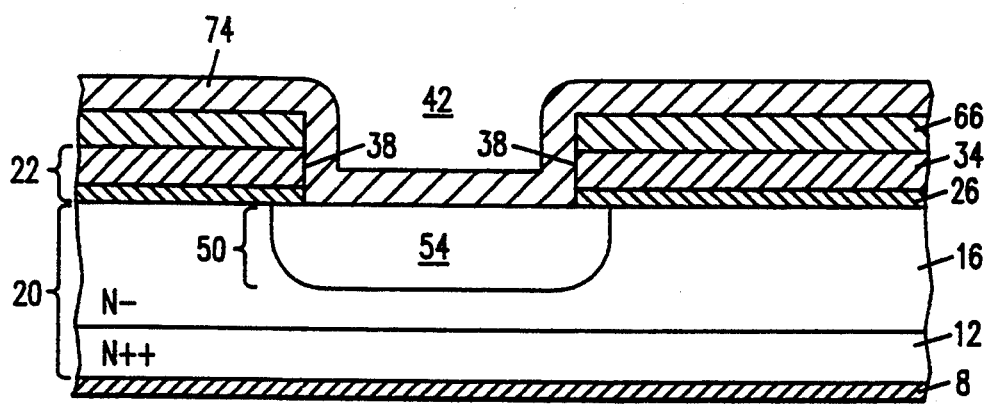

The next step, illustrated in FIG. 5, is to form a conformal doped oxide layer 74 containing donor atoms (preferably phosphorous) on insulating layer 66, on side walls 38 and on the exposed surface of p-type region 54. This is preferably accomplished using conventional chemical vapor deposition techniques. The thickness of layer 74 determines the lateral dimension of the oxide spacer. Typically it will be at least as thick as layer 66. The impurity concentration within layer 74 will be about 5% to 10% by volume.

Figure 6:
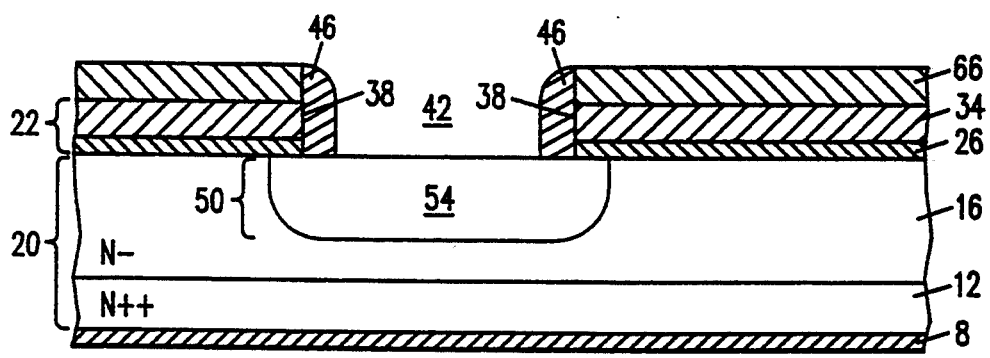
Figure 7:
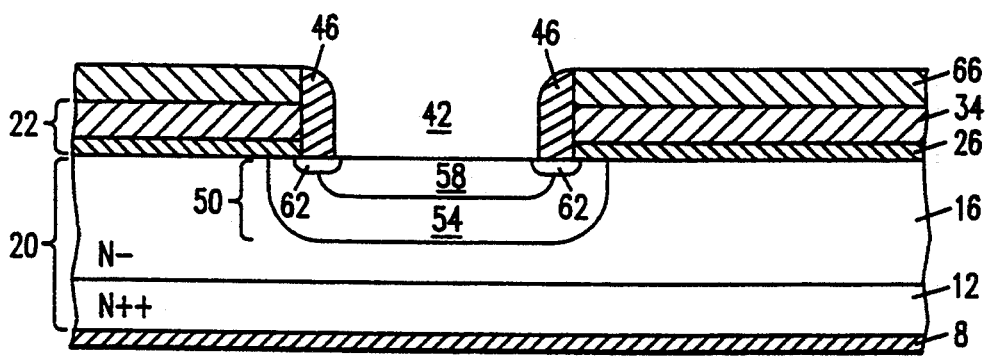

The next step, illustrated in FIG. 6, is to perform an anisotropic etch to remove oxide layer 74 from above insulating layer 66 and p-type region 54. By etching anisotropically for a period sufficient to just remove layer 74 from the surface of P-type region 54 and insulating layer 66, the anisotropic etch leaves the doped oxide spacers 46 which complete the isolation of gate region 22. By forming insulating layer 66 on gate region 22 before etching to form aperture 42 and by completing the isolation of gate region 22 with oxide spacers 46, critical mask alignments are avoided. Then, as shown in FIG. 7, a large dose boron implant is made to the exposed surface of p-type region 54. About $5 \times 10^{15}$ atoms per square centimeter are introduced. The acceptor atoms are activated and driven in by heating the wafer. During this process, the donor atoms diffuse out of the doped oxide spacers 46 to form n-type source regions 62. Since source regions 62 are formed by out diffusion from the doped oxide spacers 46, the size and depth of source regions 62, as well as the alignment of the p-type region 58 relative thereto, may be carefully controlled.

Figure 8:
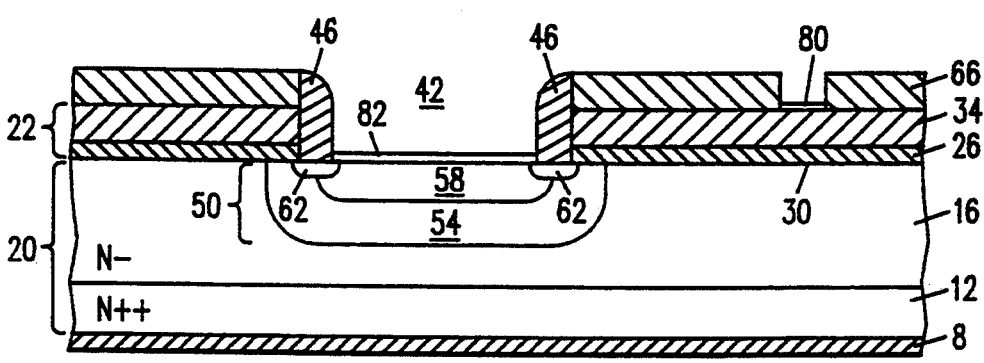

In the next step, illustrated in FIG. 8, a contact mask is applied and insulating layer 66 is etched away wherever interconnections to the polysilicon gate electrode 34 are desired. Then, an optional metal silicide or silicide forming metal is deposited to form conductive metal silicide areas 80 and 82 to reduce contact resistance to the source regions 62, where the source regions have diffused laterally from beneath spacers 46, and to the gate electrode 34.

Finally, top side metal 70 (FIG. 1) is deposited, masked, and etched to form interconnections to the gate and source electrodes. This metal typically comprises an aluminum alloy (with copper and silicon) which is approximately 2 to 3 microns thick. A top side passivation layer 74, typically vapox or nitride, is applied for scratch protection.

While the above is a complete description of a preferred embodiment of the present invention, various modifications will be obvious to those skilled in the art. For example, a p channel enhancement mode MOSFET may be constructed by using semiconductor material having a conductivity opposite the semiconductor material used in the regions of the n channel embodiment disclosed. Consequently, the scope of the invention should not be limited, except as properly described in the claims.

We claim:

1. A method of fabricating a field effect transistor of the type having a semiconductor layer doped for defining a first conductivity type drain region, a first oxide layer on the semiconductor layer, and a polycrystalline silicon layer on the first oxide layer for defining a gate electrode, wherein side edges of the first oxide layer and the polycrystalline layer define an opening for exposing a portion of the semiconductor layer that is doped for defining a second conductivity type region which extends laterally beneath the gate electrode, the method comprising the steps of:
   depositing a conformal second oxide layer doped with first conductivity type impurity;
   anisotropically etching the second oxide layer for forming spacers on the side edges of the first oxide layer and the polycrystalline silicon layer;
   out-diffusing the first conductivity type impurity from the spacers into the semiconductor layer for forming first conductivity type source regions in the semiconductor layer, the source regions laterally extending into the exposed portion of the semiconductor layer; and
   wherein portions of the second conductivity type region between the source regions and the drain region define channel regions for the field effect transistor.

2. The method according to claim 1 wherein the first conductivity type impurity comprises an n-type impurity, and wherein the second conductivity type impurity comprises p-type impurity.

3. The method according to claim 1 wherein the first conductivity type impurity comprises a p-type impurity, and wherein the second conductivity type impurity comprises an n-type impurity.

4. A method of fabricating a field effect transistor comprising the steps of:
   forming a first oxide layer on a surface of a semiconductor layer, the semiconductor layer being doped for defining a first conductivity type drain region;
   depositing a polycrystalline silicon layer on the first oxide layer for defining a gate electrode;
   anisotropically etching the first oxide layer and the polycrystalline silicon layer for exposing a portion of the semiconductor layer;
   implanting the exposed portion of the semiconductor layer with a second conductivity type impurity;
   diffusing the second conductivity type impurity for forming a second conductivity type region in the semiconductor layer, the second conductivity type region extending laterally beneath the gate electrode;
   depositing a conformal second oxide layer doped with first conductivity type impurity;
   anisotropically etching the second oxide layer for forming spacers on side edges of the first oxide layer and the polycrystalline silicon layer;
   out-diffusing the first conductivity type impurity from the spacers into the semiconductor layer for forming first conductivity type source regions in the semiconductor layer that laterally extend into the exposed portion of the semiconductor layer; and
   wherein portions of the second conductivity type region between the source regions and the drain region define channel regions for the field effect transistor.

5. The method according to claim 4 wherein the semiconductor layer comprises an epitaxial layer.

6. The method according to claim 5 wherein the first conductivity type impurity comprises an n-type impurity, and wherein the second conductivity type impurity comprises p-type impurity.

7. The method according to claim 5 wherein the first conductivity type impurity comprises a p-type impurity, and wherein the second conductivity type impurity comprises an n-type impurity.

8. A method of fabricating a field effect transistor comprising the steps of, in order:
   growing an epitaxial layer on a substrate, the epitaxial layer being doped for defining a first conductivity type drain region;
   forming a first oxide layer on a surface of the epitaxial layer;
   depositing a polycrystalline silicon layer on the first oxide layer for defining a gate electrode;
   anisotropically etching the first oxide layer and the polycrystalline silicon layer for exposing a portion of the epitaxial layer;
   implanting the exposed portion of the epitaxial layer with a second conductivity type impurity;
   diffusing the second conductivity type impurity for forming a second conductivity type region in the epitaxial layer, the second conductivity type region extending laterally beneath the gate electrode;
   depositing a conformal second oxide layer doped with first conductivity type impurity;
   anisotropically etching the second oxide layer for forming spacers on side edges of the first oxide layer and the polycrystalline silicon layer;

out-diffusing the first conductivity type impurity from the spacers into the semiconductor layer for forming first conductivity type source regions in the epitaxial layer that laterally extend into the exposed portion of the epitaxial layer; and wherein portions of the second conductivity type region between the source regions and the drain region define channel regions for the field effect transistor.

9. The method according to claim 8 further comprising the step of implanting second conductivity type impurity into the exposed portion of the substrate after etching the second oxide layer and before out-diffusing the first conductivity type impurity from the spacers.

10. The method according to claim 9 wherein the first conductivity type impurity comprises an n-type impurity, and wherein the second conductivity type impurity comprises p-type impurity.

11. The method according to claim 9 wherein the first conductivity type impurity comprises a p-type impurity, and wherein the second conductivity type impurity comprises an n-type impurity.

12. The method according to claim 8 further comprising the step of forming a third oxide layer on the polycrystalline silicon layer prior to etching the first oxide layer and the polycrystalline silicon layer, wherein the etching step comprises the step of anisotropically etching the first oxide layer, the third oxide layer, and the polycrystalline silicon layer for exposing a portion of the epitaxial layer.

13. The method according to claim 12 further comprising the step of implanting second conductivity type impurity into the exposed portion of the substrate after etching the second oxide layer and before out-diffusing the first conductivity type impurity from the spacers.

14. The method according to claim 13 wherein the first conductivity type impurity comprises an n-type impurity, and wherein the second conductivity type impurity comprises p-type impurity.

15. The method according to claim 13 wherein the first conductivity type impurity comprises a p-type impurity, and wherein the second conductivity type impurity comprises an n-type impurity.

* * * * *